(12) United States Patent
Yen

(10) Patent No.: US 6,378,015 B1
(45) Date of Patent: Apr. 23, 2002

(54) FLASH MEMORY MODULE COMPRISING AN IDE INTERFACE ENGAGEABLE IN A VERTICAL POSITION PERPENDICULAR TO A MOTHERBOARD AND HAVING AN IDE EXPANSION SLOT

(76) Inventor: George Yen, 2F, No. 8, Lane 151, Fwu Der Road, Taipei (TW)

( * ) Notice: Subject to any disclaimer, the term of this patent is extended or adjusted under 35 U.S.C. 154(b) by 0 days.

(21) Appl. No.: 09/236,398

(22) Filed: Jan. 25, 1999

(51) Int. Cl.[7] .............................................. G06F 13/14
(52) U.S. Cl. .......................... 710/102; 710/2; 711/115; 713/2; 439/61
(58) Field of Search ..................... 710/102, 2; 711/115; 713/2; 439/61

(56) References Cited

U.S. PATENT DOCUMENTS

| | | | | |
|---|---|---|---|---|
| 5,604,871 A | * | 2/1997 | Pecone ........................ | 395/281 |
| 5,778,418 A | * | 7/1998 | Auclair et al. ............... | 711/101 |
| 5,860,083 A | * | 1/1999 | Sukegawa ................... | 711/103 |
| 6,016,530 A | * | 1/2000 | Auclair et al. ................ | 711/6 |
| 6,078,967 A | * | 6/2000 | Fulghum ....................... | 710/2 |
| 6,108,730 A | * | 8/2000 | Dell et al. ................... | 710/102 |
| 6,129,556 A | * | 10/2000 | Sihn et al. ..................... | 439/61 |

\* cited by examiner

*Primary Examiner*—Thomas Lee
*Assistant Examiner*—Abdelmoniem Elamin
(74) *Attorney, Agent, or Firm*—Dougherty & Troxell

(57) ABSTRACT

A disk on module includes a flash memory array, an IDE interface connector compatible to a standard computer IDE interface for connection to a mother board for computer in a vertical position perpendicular to the mother board, an IDE expansion slot for connection to a disk drive through a cable, a flash memory array formed of a number of flash memories for data storage, a single chip flash memory controller for controlling data access and addressing of data to be stored in the flash memory array, a master/slave switch controlled to assign the master/slave memory, a read-only switch controlled to start a read-only function, enabling installed program and storage data to be changed to a read-only state permanently, and a power socket for receiving a power plug to obtain power supply from it.

4 Claims, 5 Drawing Sheets

FLASH MEMORY MODULE COMPRISING AN IDE INTERFACE ENGAGEABLE IN A VERTICAL POSITION PERPENDICULAR TO A MOTHERBOARD AND HAVING AN IDE EXPANSION SLOT

BACKGROUND OF THE INVENTION

The present invention relates to a memory module for use in a computer system, and more particularly to a disk on module which uses a flash memory array for storing data, and an IDE interface for connection to a regular disk drive interface.

The memory modules for regular computer systems are commonly modularized from DRAMs (dynamic random access memories). When the power of a computer system is turned off, the data in the memory module of the computer system is disappeared. Therefore, conventional memory modules can only be used for storing data temporarily. Data which must be maintained intact after turning off the computer shall be stored in a hard diskdrive. Because a hard disk drive uses a plurality of read-write heads to read/write data on the surface of a disk that is rotated at a high speed, it tends to be damaged by shocks. Further, because a hard disk drive is not a modularized device, it is difficult to make a hard disk drive detachable. Recently, flash memory devices have been intensively used in computers for the advantage of keeping storage data intact after power off. However. conventional flash memory devices commonly support ISA (industry standard architecture) interfaces and cannot be used with IDE (intelligent drive electronics) interfaces. Regular flash memory devices that support IDE interfaces are not modularized. When a flash memory device which supports IDE interfaces is used, an IDE interface bus line must be installed for signal transmission. The use of an IDE interface bus line in a computer system complicates the arrangement of the computer system.

SUMMARY OF THE INVENTION

The present invention has been accomplished under the circumstances in view. The disk on module is a flash memory module made from flash memory elements through a solid state process. The disk on module comprises an IDE interface connector, an IDE expansion slot, a power connector, and a master/slave switch. The bootstrap can be stored in the flash memory array of the disk on module, so that the booting speed of the computer can be accelerated. The read-only switch design prohibits installed programs and storage data from damage due to improper access operation. The design of the IDE interface connector enables the disk on module to be connected to the mother board of the computer in a vertical position perpendicular to the mother board, therefore the installation of the disk on module occupies little horizontal space of the mother board.

DETAILED DESCRIPTION OF THE PREFERRED EMBODIMENT

Figure 1A:
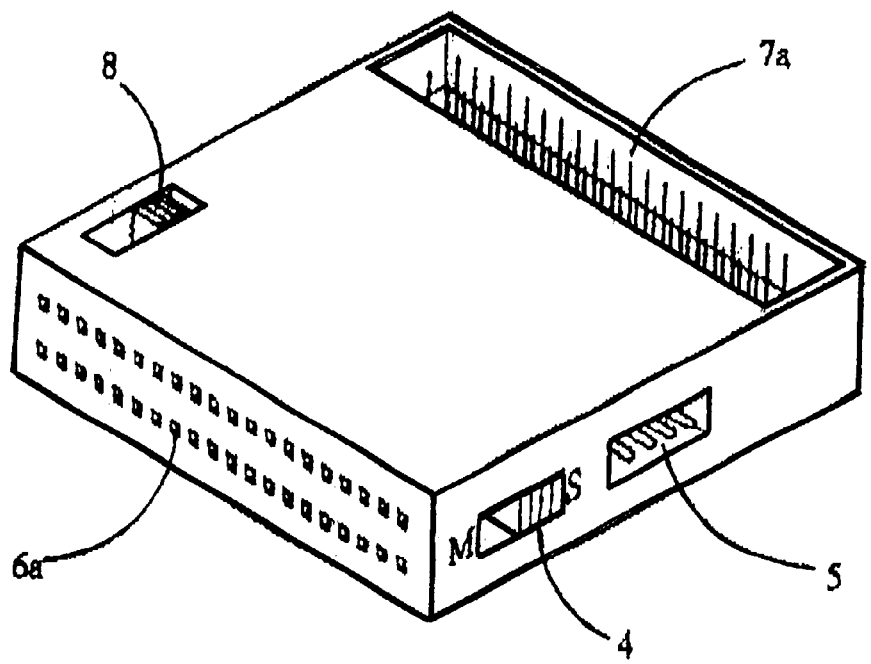
FIG. 1A is an elevational view of a disk on module according to the present invention.

Referring to FIG. 1A, a disk on module (solid state memory module) in accordance with the present invention has its electronic circuit enclosed in a shell with a master/slave switch 4 and interface means exposed to the outside.

As illustrated in FIG. 1A, the interface means of the disk on module comprises a standard IDE 40 pin interface connector 6a, a standard IDE 40 pin expansion slot 7a, and a power connector 5. The standard IDE 40 pin interface connector 6a is for connection to a standard disk drive interface, that can be perpendicularly connected to the mother board without occupying the horizontal space of the mother board. The IDE 40 pin expansion slot 7a is for connection to the existing disk drive (the disk drive of the computer in which the disk on module is installed) through a bus line, forming a master/slave connection mode. The power connector 5 is for receiving a standard 4 pin power plug. The master/slave switch 4 is used to determine which one is the master memory. If the disk on module is the master memory, or the master only memory, the operating system of the computer can be installed in the flash memory module (the disk on module). The disk on module eliminates time delay due to the action of booting or seeking, the booting speed of the computer is accelerated, and therefore the efficiency of the operating system of the computer is greatly improved.

Figure 1B:
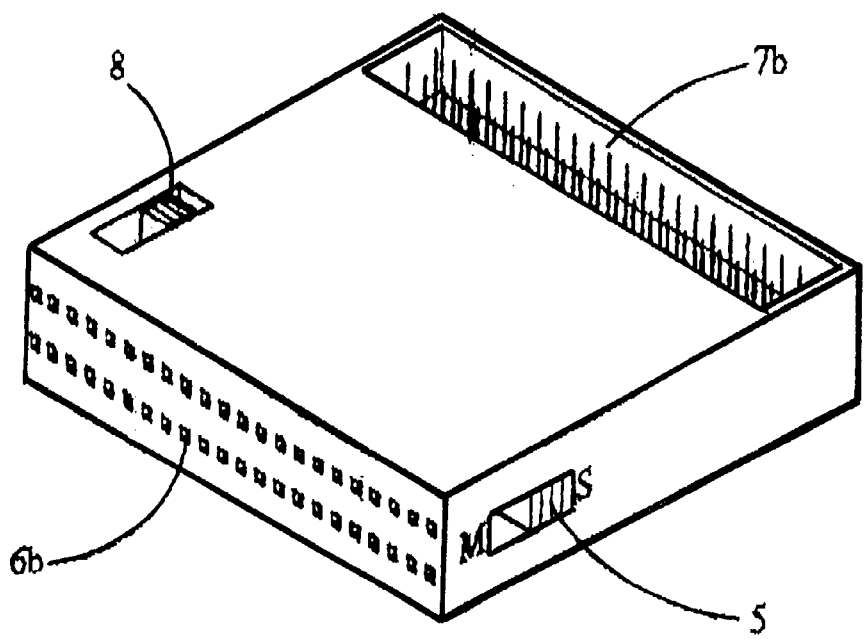
FIG. 1B is an elevational view of a disk on module according to an alternate form of the present invention.
Figure 2:
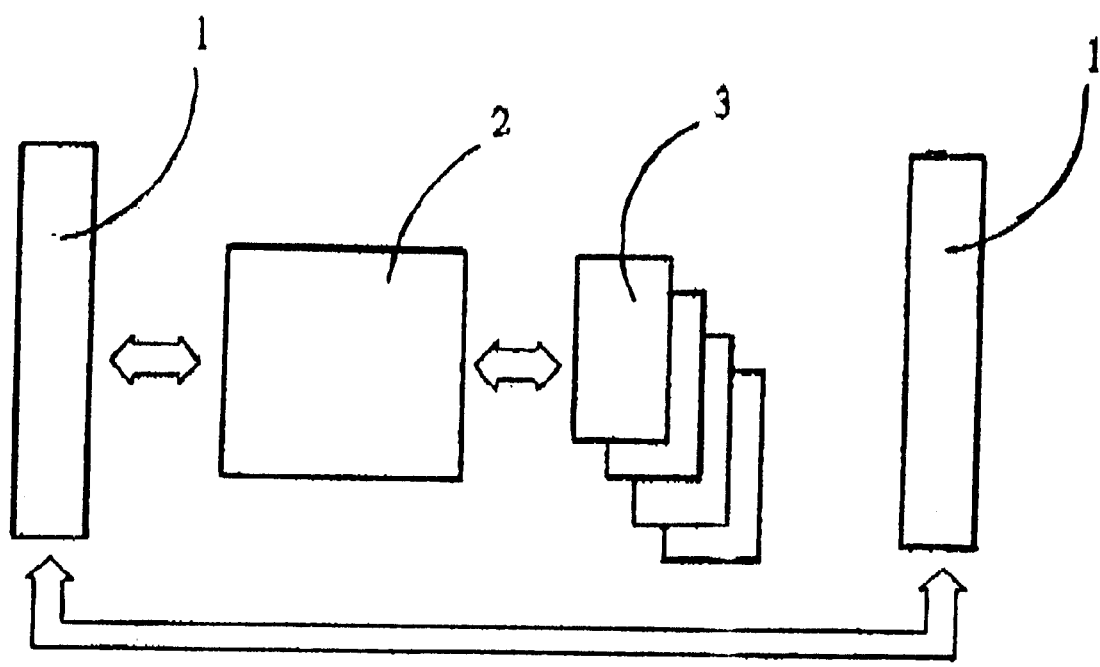
FIG. 2 is a circuit block diagram of the present invention.

FIG. 1B shows a disk on module according to an alternate form of the present invention. According to this alternate form, the standard IDE 40 pin interface connector 6a and the power connector 5 shown in FIG. 1A are synthesized into a collective IDE 40 pin interface connector 6b, and the IDE pin expansion slot 7b is a collective IDE 44 pin expansion slot matching the collective IDE 44 pin interface connector 6b.

A read-only switch 8 is provided for enabling the user to run a read-only function set in the solid state memory module. This read-only function was set during the fabrication of the solid state memory module, enabling the whole or a part of the memory area of the solid state memory module to be turned to a read-only state for reading only, preventing writing of data into it. When the read-only switch 8 is switched on, the read-only function is started, and the solid state memory module is permanently programmed for read-only operation. Unless a release program supported by the manufacturer is used, the solid state memory module cannot be returned to the state for reading and writing. This design well protects particular storage application program or data from damage due to improper access operation.

Figure 3:
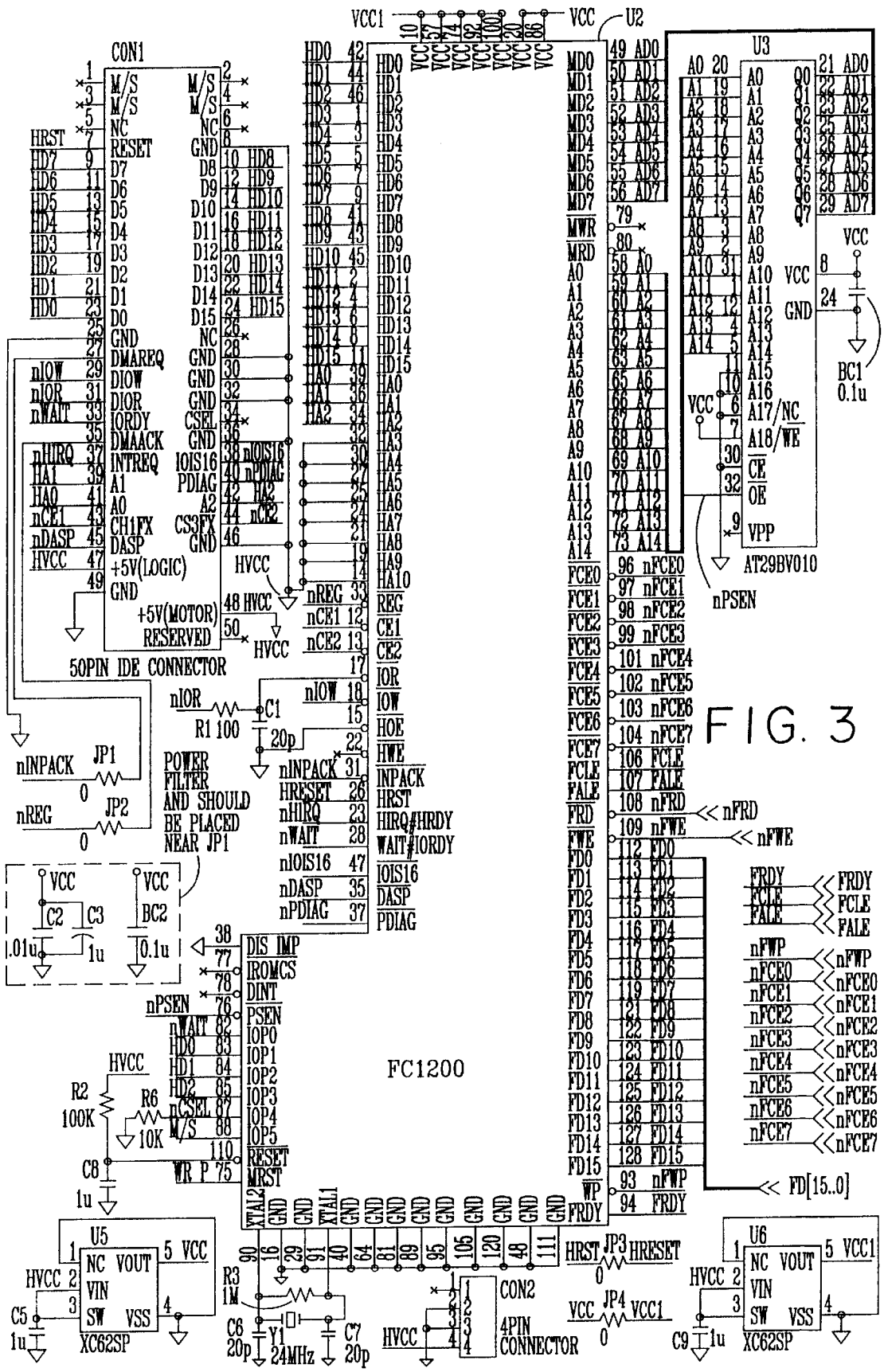
FIG. 3 is a circuit diagram of the flash memory controller and the IDE interface according to the present invention.
Figure 4A:
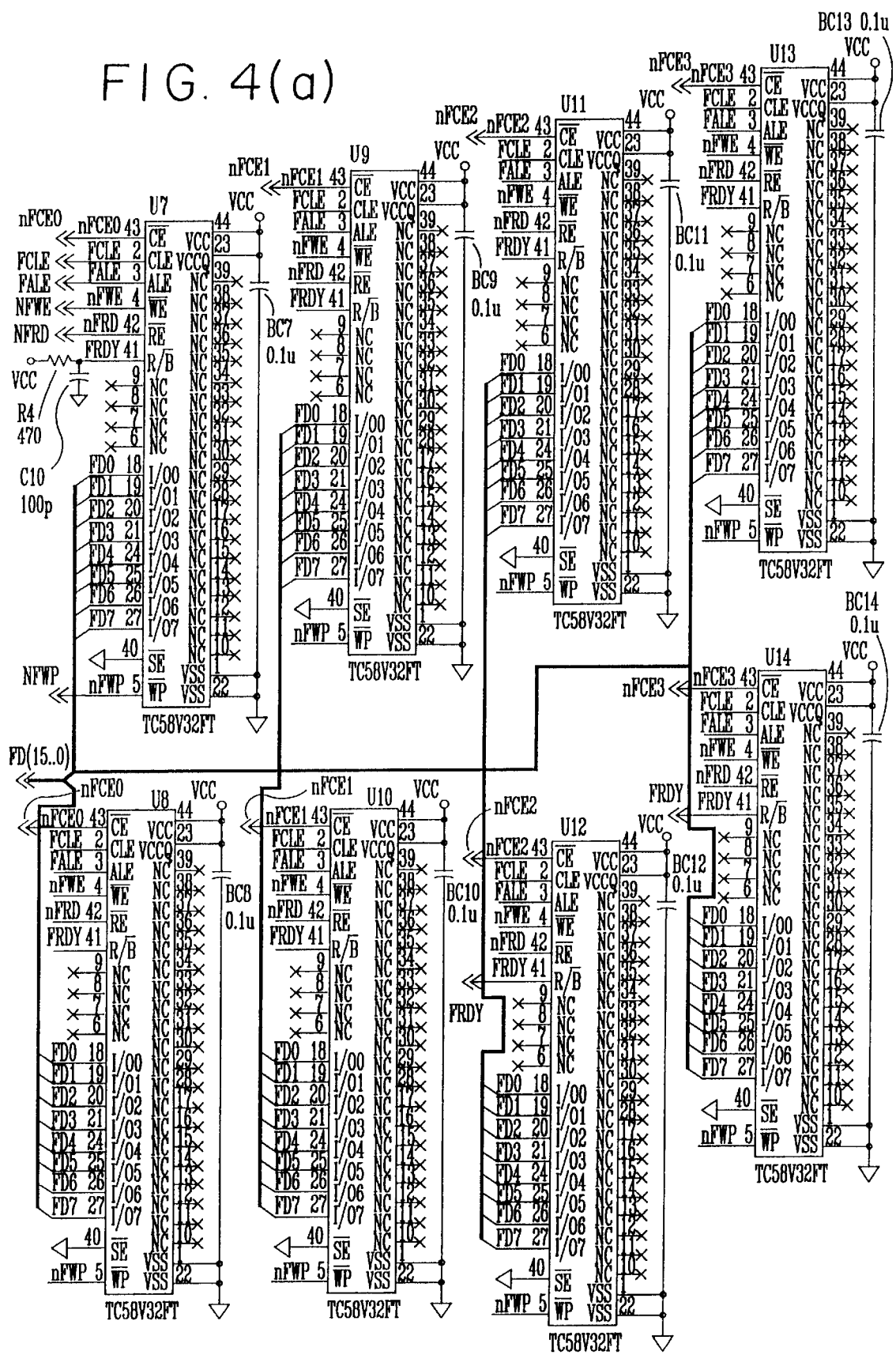
FIGS. 4(a) and 4(b) are a circuit diagram of the flash memory array according to the present invention.
Figure 4B:
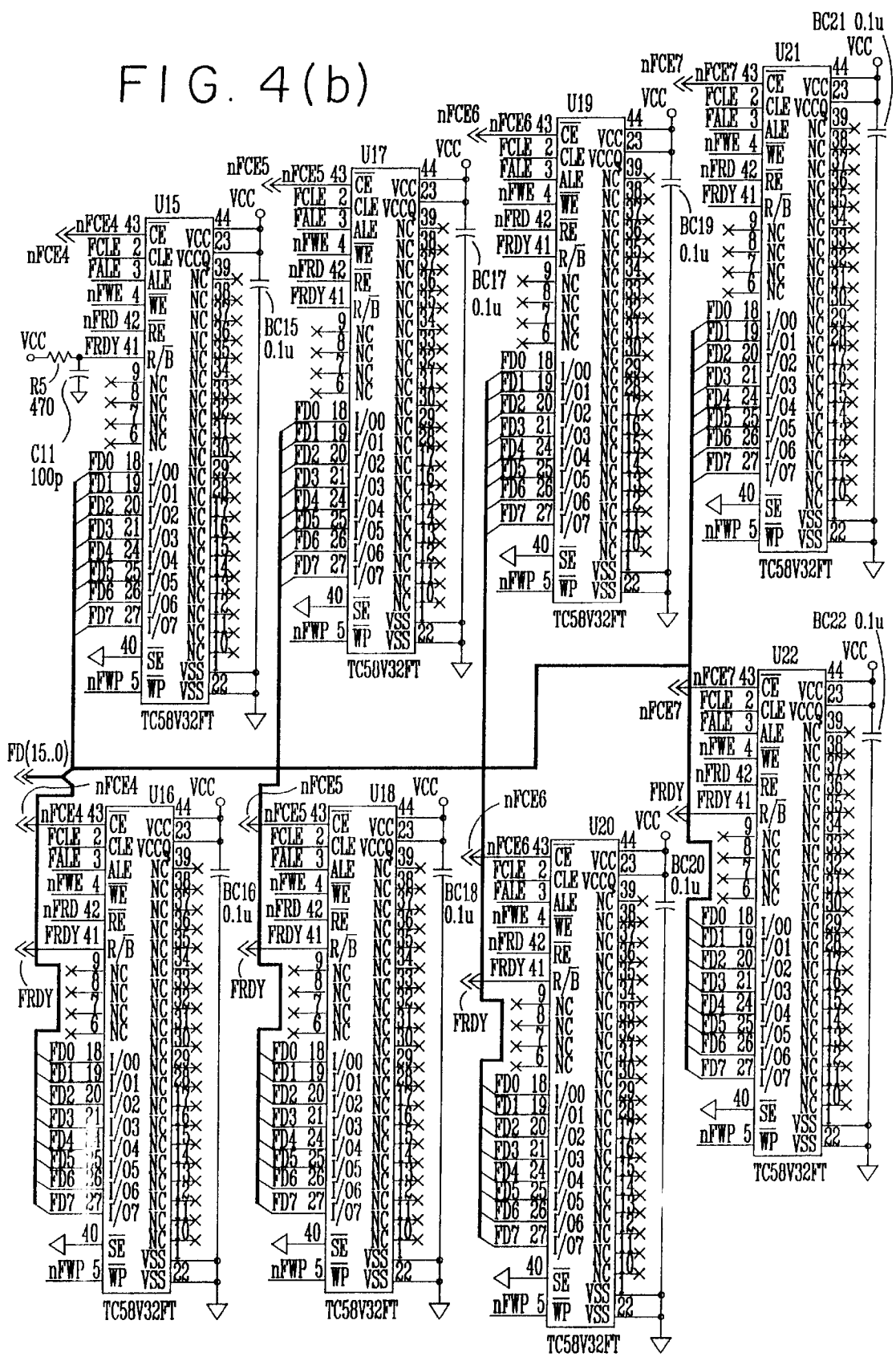

Referring to from 2 through 4, the electronic circuit of the aforesaid disk on module comprises a standard IDE interface 1, a flash memory controller 2, and a flash memory array 3 formed of a number of flash memories. The standard IDE interface 1 can be connected with an extra standard IDE interface 1 for communication with the existing hard disk drive. Data is transmitted through the standard IDE interfaces 1, controlled by the flash memory controller 2 to be stored in the flash memory array 3. The detailed circuit diagram of the standard IDE interface 1 and the flash memory controller 2 is shown in FIG. 3. The detailed circuit diagram of the flash memory array 3 is shown in FIG. 4. The flash memory controller 2 is comprised of a single chip micro controller obtained from FC1200. The flash memory array 3 is comprised of 16 flash memories. Because the flash memory controller 2 and the flash memory array 3 are single chip devices obtained from known techniques, they are not described in detail. Because the disk on module is fabricated through a solid process, it has numerous advantages including compact size, high shock proof power, low power consumption, etc. When power is off, stored data is still maintained intact. When bootstrap is installed in the disk on module, the booting speed of the computer is accelerated. The IDE interface connector design of the disk on module greatly expand the application of the computer with external electronic apparatus. The modularized design enables the disk on module to be directly connected to the mother board of a computer without through a cable. The read-only switch design prohibits installed programs and storage data from damage due to improper access operation. Further, because the disk on module is designed to be connected to the mother board of a computer in a vertical position perpendicular to the mother board, the installation of the disk on module occupies little horizontal space of the mother board.

It is to be understood that the drawings are designed for purposes of illustration only, and arc not intended as a definition of the limits and scope of the invention disclosed.

What the invention claimed is:

1. A solid state memory module for a computer having a motherboard and comprising:
   a) a parallelepiped housing having at least two edge faces and at last one side face, an area of the at least one side face being greater than an area of each of the at least two edge faces;
   b) an IDE interface connector on a first of the at least two edge faces engageable with the motherboard such that the at least one side face extends perpendicular to the motherboard;
   c) an IDE expansion slot in the at least one side face;
   d) a manually operable master/slave switch on a second of the at least two edge faces;
   e) a flash memory controller located within the housing;
   f) a plurality of memories arranged in a flash memory array for data storage and controlled by the flash memory controller; and,
   g) a manually operable read only switch located on the at least one side face for enabling the data storage to function in a read-only state.

2. The solid state memory module of claim 1 wherein the IDE interface connector comprises a collective IDE 40 pin interface connector including a power connector.

3. The solid state memory module of claim 1 wherein the IDE expansion slot comprises a collective IDE 44 pin expansion slot.

4. The solid state memory module of claim 1 further comprising a power connector on the second of the at least two edge faces.

* * * * *